United States Patent [19]

Hattori

[11] Patent Number: 4,916,710

[45] Date of Patent: Apr. 10, 1990

[54] MULTI-POINT EMISSION TYPE SEMICONDUCTOR LASER DEVICE THEREFOR

[75] Inventor: Ryo Hattori, Itami, Japan

[73] Assignee: Mitsubishi Denki Kabushiki Kaisha, Japan

[21] Appl. No.: 347,259

[22] Filed: May 4, 1989

[30] Foreign Application Priority Data

Jun. 27, 1988 [JP] Japan .................... 63-158608

[51] Int. Cl.$^4$ .............................................. H01S 3/19
[52] U.S. Cl. ........................................ 372/50; 372/23; 372/97
[58] Field of Search .......................... 372/50, 23, 97

[56] References Cited

U.S. PATENT DOCUMENTS

| | | | |
|---|---|---|---|
| 4,069,463 | 1/1978 | McGroddy et al. | 331/94.5 |
| 4,531,217 | 7/1985 | Kitamura | 372/50 |
| 4,547,956 | 10/1985 | Bouadina et al. | 372/50 |
| 4,577,321 | 3/1986 | Carney et al. | 372/50 |
| 4,747,110 | 5/1988 | Takahasi et al. | 372/50 |

FOREIGN PATENT DOCUMENTS

| | | | |
|---|---|---|---|
| 0040463 | 12/1970 | Japan | 372/50 |
| 0072288 | 4/1985 | Japan | 372/50 |
| 0223184 | 11/1985 | Japan | 372/50 |
| 61-116891 | 6/1986 | Japan . | |
| 1190829 | 5/1970 | United Kingdom . | |
| 1228989 | 4/1971 | United Kingdom . | |
| 2169134 | 7/1986 | United Kingdom . | |

OTHER PUBLICATIONS

Kume et al., "A New Monolithic . . . Disk Applications", IEEE Journal of Quantum Electronics, vol. QE-23, No. 6, Jun, 1987, pp. 898-901.

Primary Examiner—William L. Sykes
Assistant Examiner—Georgia Y. Epps
Attorney, Agent, or Firm—Leydig, Voit & Mayer

[57] ABSTRACT

A multi-point light emission type semiconductor laser device including a plurality of light emission points which are produced on a p type or n type semiconductor layer monolithically and are capable of being driven independently includes electrically insulating or semi-insulating semiconductor regions provided at intermediate portions of light emission points in the p type or n type semiconductor layer. A separation groove is further produced up to reaching the insulating or semi-insulating regions from the side opposite to the semiconductor layer. Thus, respective light emission points are perfectly electrically separated each other by this separation groove and the region.

6 Claims, 3 Drawing Sheets

MULTI-POINT EMISSION TYPE SEMICONDUCTOR LASER DEVICE THEREFOR

FIELD OF THE INVENTION

The present invention relates to a multi-point emission type semiconductor laser device having independently driven lasers in which the respective lasers do not interfere with each other and the thermal interference between the respective lasers during operation can be reduced.

BACKGROUND OF THE INVENTION

FIG. 4 shows a multi-point light emission type semiconductor laser according to the prior art. In figure 4, reference numeral 1 designates a p type semiconductor substrate. N type GaAs current blocking layers 2a and 2b are disposed on substrate 1. P type $Al_{0.5}Ga_{0.5}As$ first cladding layers 3a and 3b are disposed on blocking layers 2a and 2b, respectively. P type $Al_{0.15}Ga_{0.85}As$ active layers 4a and 4b are disposed on first cladding layers 3a and 3b, respectively. N type $Al_{0.5}Ga_{0.5}As$ second cladding layers 5a and 5b are disposed on active layers 4a and 4b, respectively. N type GaAs contact layers 6a and 6b are disposed on second cladding layers 5a and 5b, respectively. Current injection grooves 7a and 7b are provided at current blocking layers 2a and 2b, respectively. Reference numerals 8a and 8b designate light emission points of the laser device. A separation groove 9 is provided between the two light emission points 8a and 8b. N side electrodes 10a and 10b are produced on the contact layers 6a and 6b, respectively. A p side common electrode 11 is provided on the p type GaAs substrate 1. This laser device is provided on the electrically insulating submount 12. Submount electrodes 13a and 13b are provided respectively corresponding to the light emission points 8a and 8b. In this figure, this laser device is a so-called junction down mounted device where the light emission points are close to the heat sink side.

The device operates as follows.

In this prior art device, since the separation groove 9 is reaches the substrate 1, light emission points 8a and 8b are separated and do not have a common n side region. When a forward direction bias is applied between n side electrode 10a and p side electrode 11, a laser oscillation occurs at light emission point 8a, and when a forward direction bias is applied between n side electrode 10b and p side electrode 11, a laser oscillation occurs at light emission point 8b. In this way, the respective light emission points can be driven independently.

Furthermore, this prior art laser device is junction down mounted as shown in FIG. 4, and n side electrodes 10a and 10b are connected with the submount side electrodes 13a and 13b, respectively, but insulated from each other, thereby enabling independent operation of the light emitting points. The heat resistance from the respective light emission points to the heat sink is low and superior heat irradiation is obtained. Therefore, thermal interference between the respective light emission points during operation are greatly improved relative to junction up mounted in which the substrate side is bonded toward the heat sink.

In the prior art multi-point light emission type semiconductor laser device of such a construction, the respective light emission points commonly have the substrate at the p side, and they are not perfectly electrically isolated. Accordingly, the light emission output from one of the light emission points is subjected to variations dependent on the on/off operation of the other light emission point, which results in a severe problem in practical use. Furthermore, when the prior art multi-point light emission type semiconductor laser device is junction down mounted, the solder flows out- -and the respective separated electrodes may be electrically short-circuited, thereby resulting in the largest problem in the production of a this laser device. Although modifications in the configuration of the submount may be adopted as measures against these problems, these modifications cannot be adopted in junction down mounted multi-point light emission type semiconductor laser devices having more than three light emission points. A method of circulating an electrode so as not to shield the light emission from the rear side laser facet also cannot be used as a solution.

SUMMARY OF THE INVENTION

An object of the present invention is to provide a multi-point light emission type semiconductor laser device capable of electrically isolating the respective light emission points from each other without any modification in a submount in a junction down mounting.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, the intermediate portions of the respective light emission points of p type or n type semiconductor layer including a plurality of light emission points are monolithically produced with an insulating or semiinsulating semiconductor. A separation groove is provided to reach the insulating or semi-insulating semiconductor portion to electrically separate the respective light emission points. By such a construction, the respective light emission points can be independently driven without necessitating electrical isolation at the side of submount in a junction down mounting. Electrical interference can be reduced to a negligible value because only the metal electrode of submount is commonly to the light emission points.

According another aspect of the present invention, a single protrusion or plurality of protrusions are formed on an electrically insulating or semi-insulating semiconductor substrate, and a p type or n type semiconductor layer is disposed thereon burying the convex type stripe. A semiconductor laser structure of the multi-point light emission type in which the light emission points are positioned at other than a region on the protrusion is produced thereon. A , a region other than the protrusion of the insulating or semi-insulating semiconductor substrate is removed from the substrate side by polishing or etching to expose the p type or n type semiconductor layer. A groove is produced to separate the respective light emission points and to reach the protrusion from the surface opposite the substrate.

DETAILED DESCRIPTION OF THE PREFERRED EMBODIMENTS

An embodiment of the present invention will be described in detail with reference to the drawings.

Figure 1:
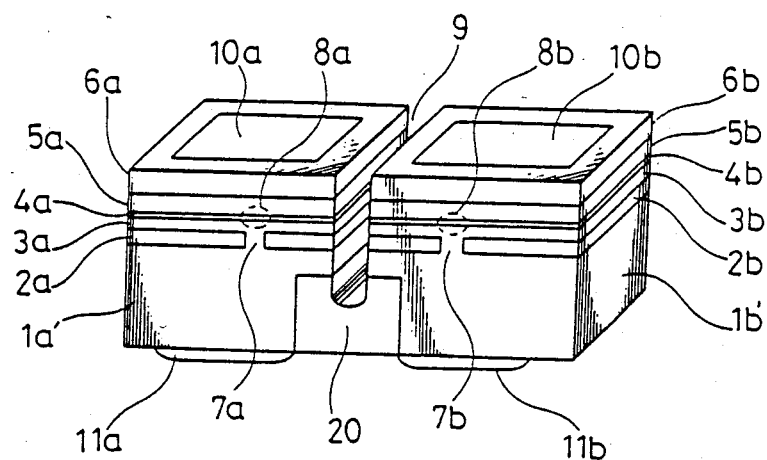
FIG. 1 is a perspective view showing a multi-point light emission type semiconductor laser device according to an embodiment of the present invention.

FIG. 1 shows a perspective view of a multi-point light emission type semiconductor laser device according to an embodiment of the present invention. In FIG. 1, reference numerals 7a' and 7b' designate p type semiconductor substrates. N type GaAs current blocking layers 2a and 2b are disposed on substrates 1a' and 1b', respectively. P type $Al_{0.5}Ga_{0.5}As$ first cladding layers 3a and 3b are disposed on blocking layers 2a and 2b, respectively. P type $Al_{0.15}Ga_{0.85}As$ active layers 4a and 4b are disposed on first cladding layer 3a and 3b, respectively. N type second cladding layers 5a and 5b are disposed on active layers 4a and 4b, respectively. N type GaAs contact layers 6a and 6b are disposed on second cladding layers 5a and 5b, respectively. Current injection regions 7a and 7b are provided in blocking layers 2a and 2b, respectively. Reference numerals 8a and 8b designate light emission points of the laser device. A separation groove 9 is provided between light emission points 8a and 8b. N side electrodes 10a and 10b are produced on contact layers 6a and 6b, respectively. P side electrodes 11a and 11b are provided on substrates 7a' and 7b', respectively. Reference numeral 20 designates a semi-insulating GaAs layer.

FIG. 2 shows the production process flow for producing the structure of the multi-point light emission type semiconductor laser device of FIG. 1. In FIG. 2, reference numeral 20' designates a semi-insulating GaAs substrate and reference numeral 1" designates a p type GaAs layer.

The production process of the device will be described.

Figure 2A:
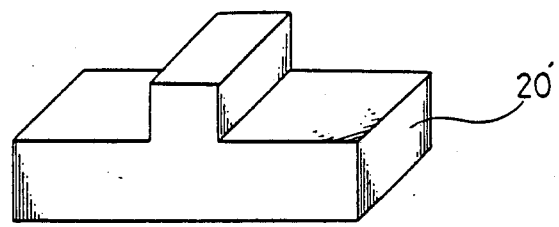
FIG. 2 (a)-2(e) are diagrams showing a production process for producing the laser device of FIG. 1.
Figure 2B:
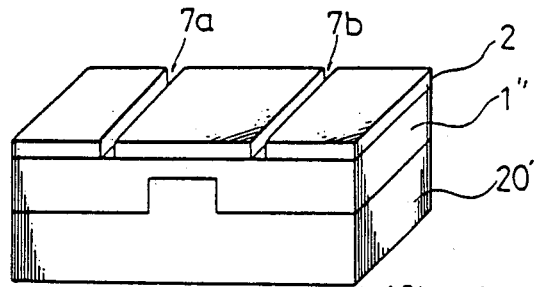
Figure 2C:
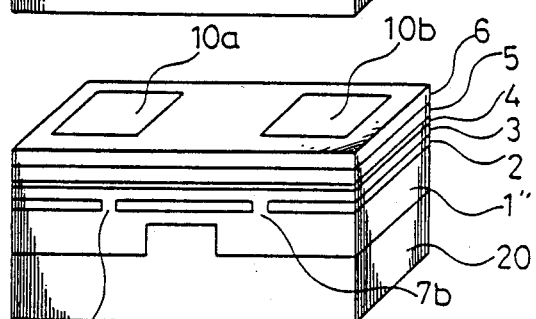
Figure 2D:
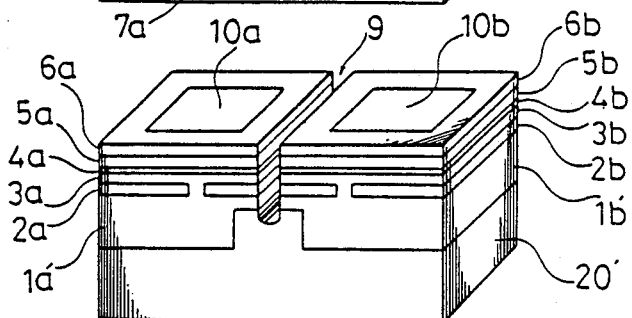
Figure 2E:
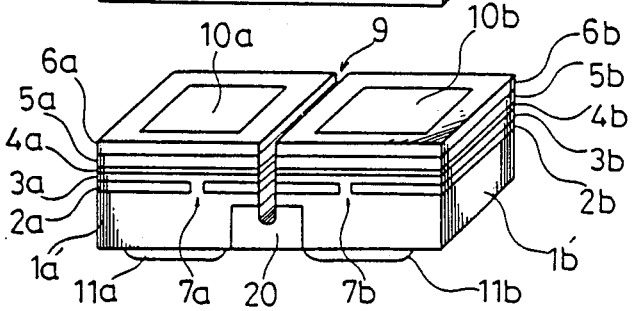
Figure 4:
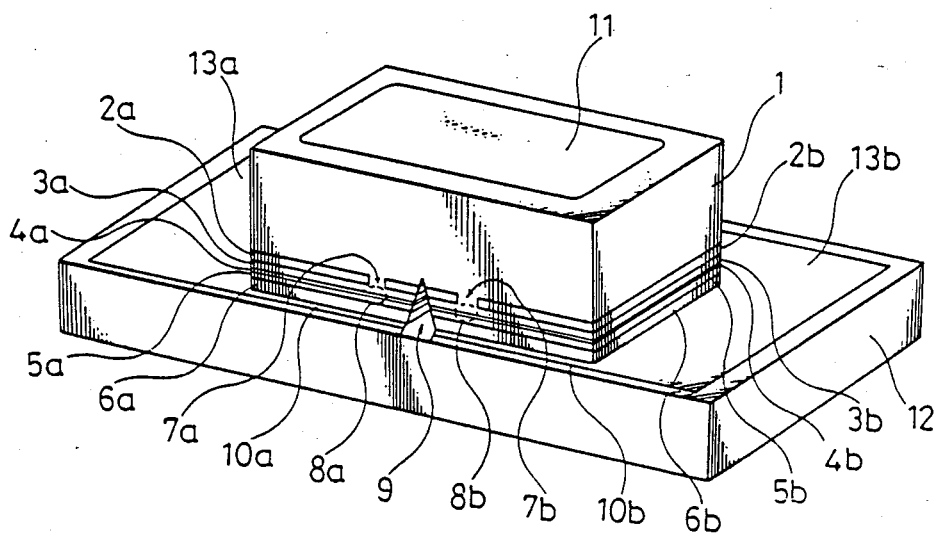
FIG. 4 is a perspective view showing a multi-point light emission type semiconductor laser device according to the prior art which is junction down mounted.

First of all, protrusion is formed on the semiinsulating GaAs substrate 20' by RIE (reactive ion etching) or RIBE (reactive ion beam etching) as shown in FIG. 2a. Next, this protrusion is buried by growing a p type GaAs layer 1" by liquid phase epitaxy. The surface of the grown p type GaAs layer 1" is made planar, for Example, by polishing--and an n type current blocking layer is deposited thereon. Thereafter, grooves 7a and 7b corresponding to the respective position of the light emission points are formed as shown in FIG. 2b. Thereafter, a first cladding layer 3, an active layer 4, a second cladding layer 5, and a contact layer 6 are deposited by an appropriate growth technique as shown in FIG. 2c. N side electrodes 10a and 10b are deposited on and form ohmic contacts with the contact layer 6. Then, as shown in FIG. 2d, a separation groove 9 extending from contact layer 6, through the intermediate layers, and reaching the protrusion of the substrate 20' is formed, for example, by etching. Thereafter, a portion of the substrate 20' is removed by polishing or etching to expose the p type GaAs layers 1a' and 1b', but leaving the protrusion portion of substrate 20' in place. P side electrodes 11a and 11b are deposited on and form ohmic contacts with the exposed p type GaAs layer 7a' and 7b', respectively, thereby producing the structure shown in FIG. 1.

The device operates as follows.

In the laser device produced as described above, the light emission points 8a and 8b are electrically separated by separation groove 9 and insulating layer 20 so they do not have an electrically common region. Therefore, electrical interference during operation of the respective light emission points can be reduced to a negligible value. Furthermore, since the electrode at the submount side can be made common to all the light emission points in a junction down mounting, the nocountermeasures against undesirable solder flow and modifications in the electrode wiring are necessary, thereby greatly enhancing the yield.

In the production of the multi-point light emission type semiconductor laser device of the present invention, the p type GaAs semiconductor buried layer is made flat and this makes it possible to utilize various practical methods for producing a laser structure.

While in the above described embodiment a two-point light emission type semiconductor laser is described, a junction down mounted multi-point light emission type semiconductor laser device having more than three light emission points, which has been quite difficult to produce, can be easily realized.

Figure 3:
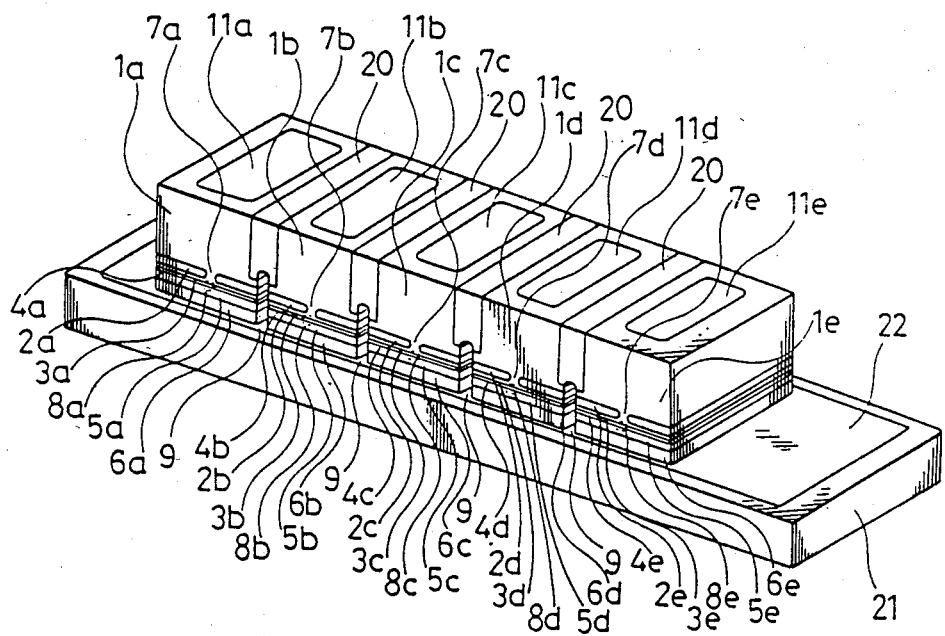
FIG. 3 is a perspective view showing a multi-point light emission type semiconductor laser device according to another embodiment of the present invention which is junction down mounted.

FIG. 3 shows a five-point light emission type semiconductor laser device that is junction down mounted on a submount and has a single electrode according to another embodiment of the present invention. In FIG. 3, the same reference numerals as those shown in FIG. 1 designate the same or corresponding elements. Reference character suffixes a, b, c, d, and e represent corresponding elements of to the light emission points 8a, 8b, 8c, 8d, and 8e, respectively. Reference numeral 21 designates a submount and reference numeral 22 designates a submount electrode. As shown in FIG. 3, since the p side electrode for each light emission point is separate at the chip side even if the device is junction down mounted onto the common electrode 22, the respective light emission points from 8a to 8e can be independently driven through wires bonded to the p side electrodes 11a to 11e, respectively. Even in this case, since only metal electrode 22 at submount 21 side is common to all light emission points as described above, mutual electrical interference due to the operation of the respective light emission points can be reduced to quite small values.

As discussed above, according to the present invention, electrically insulating or semi-insulating semiconductor regions are provided intermediate portions the light emission points of an active semiconductor layer in a laser device including a plurality of light emission points. The structure is produced monolithically and the individual light emission points are capable of being driven independently. A separation groove extending through the structure and the active layer from the side of the structure opposite the insulating or semi-insulating semiconductor electrically isolates the respective light emission points from each other. Accordingly, the electrical interference during operation of the respective light emission points is reduced to a negligible value in practical use. Furthermore, since the submount side electrode is common to all light emission points in junction down mounting, no steps to prevent undesired solder flow on the submount or other short circuiting in the electrode wiring are needed, greating increasing yield. Furthermore, the junction down mounting of a multi-point light emission semiconductor laser having having three or more light emission points can be easily realized.

What is claimed is:

1. A multi-point light emission type semiconductor laser device including a plurality of light emission points which can be driven independently
   comprising:
   an electrically insulating or semi-insulating semiconductor region provided intermediate said light emission points ; and
   a separation groove
   extending from the side of the device opposite said region through said device to said region,
   electrically separating said respective light emission points from each other.

2. The semiconductor laser device of claim 1 wherein said semiconductor layer comprises GaAs.

3. A junction down mounted semiconductor laser device for junction down mounting including at least two separate light emission points comprising:
   at least two commonly formed, attached laser elements, each laser element including, serially disposed, a first electrode, a first semiconductor contacting layer of a first conductivity type, a first semiconductor cladding layer of the first conductivity type, an active semiconductor layer, a second semiconductor cladding layer of a second conductivity type, a semiconductor current blocking layer of the first conductivity type including an opening filled by part of said second cladding layer opposite a light emitting region of the element, a second semiconductor contacting layer of the second conductivity type and a second electrode wherein adjacent laser elements are attached to each other by an electrically isolating material disposed between said second contacting layers of adjacent laser elements, at least a portion of said second contacting layers being disposed on said isolating material, and are electrically separated from each other by a groove extending between said first and second contacting layers.

4. The device of claim 3 including a common substrate and a common electrode disposed on said substrate wherein said laser elements are mounted on said common substrate with said first electrodes in electrical contact with said common electrode.

5. The device of claim 3 wherein said isolating material is a semi-insulating semiconductor.

6. The device of claim 3 wherein said isolating material is an insulating semiconductor.

* * * * *